United States Patent
Takano et al.

(10) Patent No.: US 9,437,777 B2
(45) Date of Patent: Sep. 6, 2016

(54) SEMICONDUCTOR DEVICE WITH ANTENNA AND LIGHT-EMITTING ELEMENT

(71) Applicant: Semiconductor Energy Laboratory Co., Ltd., Atsugi-shi, Kanagawa-ken (JP)

(72) Inventors: Tamae Takano, Atsugi (JP); Nobuharu Ohsawa, Zama (JP); Kiyoshi Kato, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/306,559

(22) Filed: Jun. 17, 2014

(65) Prior Publication Data

US 2014/0291800 A1  Oct. 2, 2014

Related U.S. Application Data

(63) Continuation of application No. 11/702,055, filed on Feb. 5, 2007, now Pat. No. 8,772,917.

(30) Foreign Application Priority Data

Feb. 10, 2006  (JP) .................................. 2006-033473

(51) Int. Cl.
*H01L 33/00*  (2010.01)
*H01L 35/24*  (2006.01)
(Continued)

(52) U.S. Cl.
CPC .......... *H01L 33/36* (2013.01); *H01L 23/49838* (2013.01); *H01L 23/5227* (2013.01);
(Continued)

(58) Field of Classification Search
CPC ............... H01L 27/13; H01L 27/1214; H01L 23/49855; H01L 2223/6677; H01L 23/5227; H01L 27/0688; H01L 27/112; H01L 27/11293; H01L 27/1052; H01L 2251/5338; H01L 33/36; H01L 33/387; H01L 51/5012; H01L 51/5203
USPC ......... 257/E27.113, E27.111, 679, 529, 531, 257/528, 922, 536, E51.008, 40, 5, 98
See application file for complete search history.

(56) References Cited

U.S. PATENT DOCUMENTS 5,523,595 A  6/1996  Takenaka et al.
6,160,526 A  12/2000  Hirai et al.
(Continued)

FOREIGN PATENT DOCUMENTS

EP  0514547 A  11/1992
EP  1039476 A  9/2000
(Continued)

OTHER PUBLICATIONS

Office Action (Application No. 200710008080.5) Dated Nov. 27, 2009.

*Primary Examiner* — Shouxiang Hu
(74) *Attorney, Agent, or Firm* — Robinson Intellectual Property Law Office; Eric J. Robinson

(57) ABSTRACT

When a conductive layer occupying a large area is provided in a coiled antenna portion, it has been difficult to supply power stably. A memory circuit portion and a coiled antenna portion are disposed by being stacked together; therefore, it is possible to prevent a current from flowing through a conductive layer occupying a large area included in the memory circuit portion, and thus, power saving can be achieved. In addition, the memory circuit portion and the coiled antenna portion are disposed by being stacked together, and thus, it is possible to use a space efficiently. Therefore, downsizing can be realized.

4 Claims, 10 Drawing Sheets

(51) Int. Cl.
*H01L 29/00* (2006.01)
*H01L 33/36* (2010.01)
*H01L 51/50* (2006.01)
*H01L 51/52* (2006.01)
*H01L 23/522* (2006.01)
*H01L 27/06* (2006.01)
*H01L 27/12* (2006.01)
*H01L 27/13* (2006.01)
*H01Q 1/22* (2006.01)
*H01Q 9/27* (2006.01)
*H01L 51/05* (2006.01)
*H01L 23/498* (2006.01)
*H01L 23/66* (2006.01)
*H01F 5/00* (2006.01)

(52) U.S. Cl.
CPC ........... *H01L23/66* (2013.01); *H01L 27/0688* (2013.01); *H01L 27/1203* (2013.01); *H01L 27/1214* (2013.01); *H01L 27/1255* (2013.01); *H01L 27/13* (2013.01); *H01L 51/05* (2013.01); *H01L 51/5012* (2013.01); *H01L 51/5203* (2013.01); *H01Q 1/2283* (2013.01); *H01Q 9/27* (2013.01); *H01F 5/003* (2013.01); *H01L 2223/6672* (2013.01); *H01L 2223/6677* (2013.01); *H01L 2924/0002* (2013.01); *H01L 2924/12044* (2013.01); *Y10S 257/922* (2013.01)

(56) References Cited

U.S. PATENT DOCUMENTS

| | | |
|---|---|---|
| 6,420,741 B1 | 7/2002 | Nakajima |
| 6,828,685 B2 | 12/2004 | Stasiak |
| 7,075,105 B2 | 7/2006 | Kano |
| 7,276,436 B2 | 10/2007 | Kawai et al. |
| 7,405,665 B2 | 7/2008 | Yamazaki |
| 7,630,233 B2 | 12/2009 | Kato et al. |
| 7,714,633 B2 | 5/2010 | Kato |
| 7,973,313 B2 | 7/2011 | Arai et al. |
| 8,045,369 B2 | 10/2011 | Kato et al. |
| 8,054,121 B2 | 11/2011 | Kato |
| 8,193,532 B2 | 6/2012 | Arai et al. |
| 8,772,917 B2 * | 7/2014 | Takano et al. ................ 257/679 |
| 2003/0156449 A1 | 8/2003 | Ooishi |
| 2004/0164302 A1 | 8/2004 | Arai et al. |
| 2005/0133790 A1 | 6/2005 | Kato |
| 2005/0134463 A1 | 6/2005 | Yamazaki |
| 2006/0220252 A1 | 10/2006 | Yukawa et al. |
| 2007/0215869 A1 | 9/2007 | Moriya et al. |

FOREIGN PATENT DOCUMENTS

| | | |
|---|---|---|
| EP | 1432021 A | 6/2004 |
| EP | 1453088 A | 9/2004 |
| JP | 04-102367 A | 4/1992 |
| JP | 04-167719 A | 6/1992 |
| JP | 11-011058 A | 1/1999 |
| JP | 2000-269446 A | 9/2000 |
| JP | 2001-101368 A | 4/2001 |
| JP | 2001-345431 A | 12/2001 |
| JP | 2004-304180 A | 10/2004 |
| JP | 2005-202947 A | 7/2005 |
| JP | 2005-317955 A | 11/2005 |
| JP | 2005-322899 A | 11/2005 |
| TW | 200421356 | 10/2004 |
| TW | 200509378 | 3/2005 |
| WO | WO-2005/096380 | 10/2005 |
| WO | WO-2005/098955 | 10/2005 |
| WO | WO-2006/028195 | 3/2006 |
| WO | WO-2006/062175 | 6/2006 |

* cited by examiner

SEMICONDUCTOR DEVICE WITH ANTENNA AND LIGHT-EMITTING ELEMENT

BACKGROUND OF THE INVENTION

1. Field of the Invention

The present invention relates to a semiconductor device for exchanging data by wireless communication. In particular, the present invention relates to a semiconductor device for exchanging data by wireless communication with the use of an electromagnetic induction method.

It is to be noted that, in this specification, a semiconductor device refers to a device in general which can function by utilizing a semiconductor characteristic, and an electrooptic device, a semiconductor circuit, and an electronic appliance are all included in the semiconductor device.

2. Description of the Related Art

In recent years, an individual identification technology using a semiconductor device for exchanging data by wireless communication has attracted attention. The individual identification technology using the semiconductor device has started to be useful for production, management, or the like of an individual object and has started to be applied to personal authentication. Such a semiconductor device is also referred to as an RFID (Radio Frequency Identification) tag, an IC (Integrated Circuit) tag, an IC chip, an RF tag, a wireless tag, and an electronic tag.

A semiconductor device for exchanging data by an electromagnetic induction method (see Patent Document 1: Japanese Published Patent Application No. H11-11058) will be explained with reference to FIG. 10. A semiconductor device 301 has a coiled antenna portion 302 and a semiconductor circuit portion 303. A terminal 304 of the semiconductor circuit portion 303 is electrically connected to one end 305 of the coiled antenna portion 302. A terminal 306 of the semiconductor circuit portion 303 is electrically connected to the other end 307 of the coiled antenna portion 302.

When a reader/writer including the coiled antenna portion is brought close to the semiconductor device 301, an alternating magnetic field is generated from the coiled antenna portion included in the reader/writer. The alternating magnetic field penetrates the coiled antenna portion 302 in the semiconductor device 301, and an electromotive force is generated between the terminals (one end 305 and the other end 307) of the coiled antenna portion 302 in the semiconductor device 301 due to electromagnetic induction. The semiconductor circuit portion 303 in the semiconductor device 301 is operated by the electromotive force generated due to the electromagnetic induction.

SUMMARY OF THE INVENTION

As described above, in a semiconductor device for exchanging data by an electromagnetic induction method, power is supplied with the use of an antenna. For this reason, it has been difficult to supply power stably. Therefore, it has been necessary to suppress power consumption as much as possible.

When there has been a conductive layer occupying a large area in a coiled antenna portion, a current has flown also through the conductive layer due to influence of electromagnetic induction. That is, when there has been the conductive layer occupying the large area in the coiled antenna portion, it has been difficult to supply power stably.

It is an object of the present invention to provide a semiconductor device which prevents influence of electromagnetic induction on a conductive layer occupying a large area and realizes stabilization of power supply by devising a placement of a coiled antenna portion and the conductive layer.

According to one feature of the present invention, in an element (for example, a memory element, a light-emitting element, a sensor element, or the like) in which a conductive layer occupying a large area in a semiconductor device having an antenna is used as one of a pair of electrodes, the antenna and the conductive layer at least partially overlap with each other.

According to another feature of the present invention disclosed in this specification, a semiconductor device at least includes, over a substrate having an insulating surface, a plurality of integrated circuits; an antenna having a spiral shape (also referred to as a spiral shape in one plane or a coiled shape) as its main structure; a first electrode; a second electrode; and a layer containing an organic compound interposed between the first electrode and the second electrode, where the antenna is electrically connected to at least one of the plurality of integrated circuits, the first electrode or the second electrode is electrically connected to at least one of the plurality of integrated circuits, and the antenna overlaps with the second electrode.

The antenna may also be disposed so as to overlap with a transistor. According to another feature of the present invention, a semiconductor device at least includes, over a substrate having an insulating surface, a plurality of integrated circuits; a transistor; an antenna having a spiral shape (also referred to as a spiral shape in one plane or a coiled shape) as its main structure; a first electrode; a second electrode; and a layer containing an organic compound interposed between the first electrode and the second electrode, where the antenna is electrically connected to at least one of the plurality of integrated circuits, the first electrode or the second electrode is electrically connected to at least one of the plurality of integrated circuits, the transistor is electrically connected to the first electrode, and the antenna overlaps with the second electrode and the transistor. Further, when the antenna overlaps with the transistor of the integrated circuit as well as the second electrode, part of the integrated circuit is also disposed outside a region surrounded by the antenna.

It is to be noted that the first electrode, the second electrode, and the layer containing the organic compound interposed between these electrodes are included in a memory element, a light-emitting element, a sensor element, and the like. It is preferable that these elements be disposed so that an area of one or both of the electrodes is relatively large and at least part of the element overlaps with the antenna.

It is an advantage of a memory element using an organic material that counterfeiting becomes extremely difficult because the organic material exposed to the air is easily deformed and a material which is used is not easily identified in a case where others try to break down the element for the purpose of counterfeiting.

In order to prevent falsification or abuse of information, the number of writings to a memory is set to be one in a case where an organic material or an inorganic material in which reversible phase change does not occur is used for the layer containing the organic compound of the memory element.

In addition, for repeated use, plural rewritings of data to the memory becomes possible in the case where the organic material (for example, bathophenanthroline (abbreviated to BPhen)) or the inorganic material in which reversible phase change does not occur is used for the layer containing the organic compound of the memory element. Also, a reader/writer may allow both writing and reading to/from the memory element in which the organic material is used.

Another feature of the present invention is that, in each of the above structures, the antenna includes a power feeding portion and a plurality of linear or stripe-shaped antenna conductors, and the antenna conductor is provided in spirals from a periphery of the power feeding portion toward the power feeding portion. The antenna conductor may also be elliptical or circular.

In each of the above structures, the integrated circuit is, for example, a writing circuit, a reading circuit, a sense amplifier, an output circuit, a buffer, or the like.

The above means is not just a designing point but a point invented after a placement of a memory, an antenna, or a wiring; manufacture of a semiconductor device including a memory circuit using the placement; a writing operation or a reading operation; and a deep consideration by the inventors.

Since the conductive layer occupying the large area can be disposed in a region overlapping with the antenna by the present invention, a space can be efficiently used in comparison with a semiconductor device in which nothing is disposed in the region overlapping with the antenna. Therefore, downsizing of the semiconductor device can be realized.

The memory circuit portion and the coiled antenna portion are disposed by being stacked together; therefore, it is possible to prevent a current from flowing through the conductive layer occupying the large area, and thus, power saving can be achieved.

DETAILED DESCRIPTION OF THE INVENTION

Figure 1A:
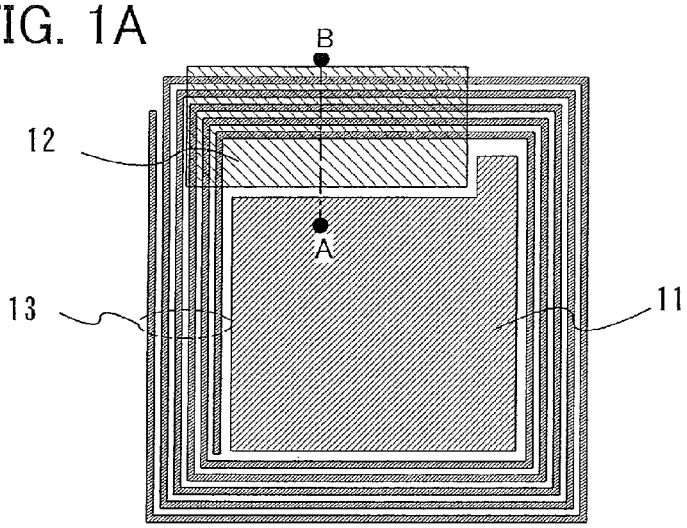
FIGS. 1A to 1C are a view for explaining a structure of a semiconductor device according to the present invention, a view for explaining a structure of a semiconductor device according to the present invention, and a view for explaining a comparative example, respectively.

Embodiment Mode of the present invention will be explained in detail with reference to the drawings. However, the present invention is not limited to the description below and it is easily understood by those skilled in the art that the modes and details can be modified in various ways without departing from the purpose and the scope of the present invention. Therefore, the present invention is not interpreted as being limited to the description of the embodiment modes to be given below. It is to be noted that, in the structure of the present invention described below, the same portions in different drawings are denoted by the same reference numerals.

[Embodiment Mode 1]

A semiconductor device of the present invention has a semiconductor circuit portion 11, a memory circuit portion 12, and a coiled antenna portion 13. The memory circuit portion 12 has a plurality of memory elements. Each of the plurality of memory elements has a structure in which a layer containing an organic compound is interposed between a pair of electrodes. One or both of the pair of electrodes included in each of the plurality of the memory elements is used in common in the plurality of memory elements. Therefore, one of the pair of electrodes included in each of the plurality of memory elements becomes a conductive layer occupying a large area. In the present invention, the memory circuit portion 12 and the coiled antenna portion 13 are disposed so as to overlap with each other in order to prevent a current from flowing through the conductive layer occupying the large area included in the memory circuit portion 12 due to influence of electromagnetic induction.

Figure 1B:
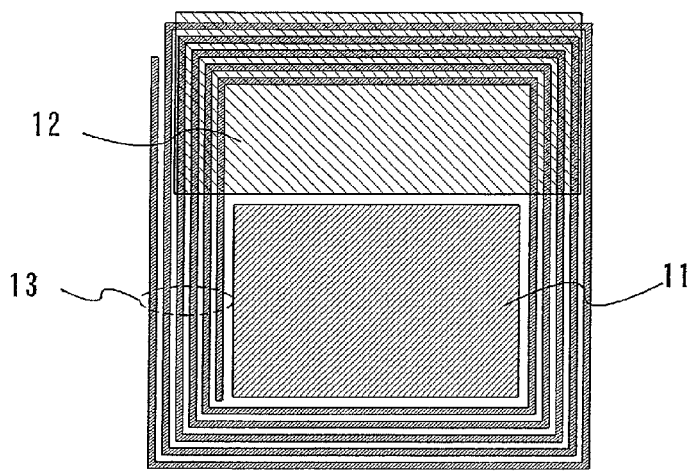
Figure 1C:
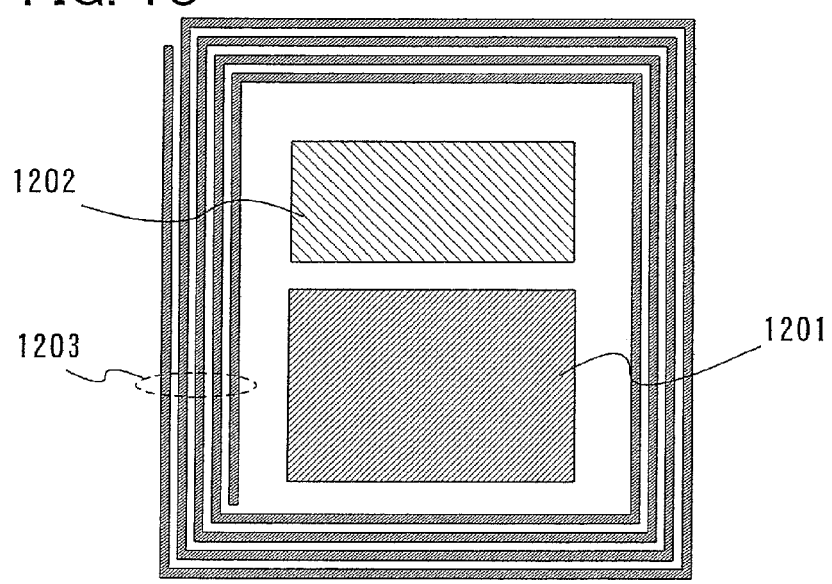

A top surface structure of the semiconductor device of the present invention will be explained. In the explanation below, the semiconductor device is compared with a semiconductor device in which a semiconductor circuit portion, a memory circuit portion, and a coiled antenna portion are provided and the memory circuit portion and the coiled antenna portion do not overlap with each other (see FIG. 1C). It is to be noted that the semiconductor device shown in FIG. 1C is not the semiconductor device of the present invention but the semiconductor device for a comparative example. The semiconductor device shown in FIG. 1C has a semiconductor circuit portion 1201, a memory circuit portion 1202, and an antenna portion 1203. It is to be noted that a first terminal of the semiconductor circuit portion 1201 is electrically connected to one end of the coiled antenna portion 1203, and a second terminal of the semiconductor circuit portion 1201 is electrically connected to the other end of the coiled antenna portion 1203. The semiconductor circuit portion 1201 and the memory circuit portion 1202 are electrically connected to each other.

In a case where an area occupied by the memory circuit portion 12 is the same as that in FIG. 1C and the memory circuit portion 12 and the coiled antenna portion 13 are disposed so as to overlap with each other (see FIG. 1A), the area occupied by the semiconductor circuit portion 11 can be enlarged. If the area occupied by the semiconductor circuit portion 11 can be enlarged, more plural elements can be provided; therefore, a high-performance circuit can be provided. Although FIG. 1A shows an example in which the number of coils of the coiled antenna portion 13 is more than 5, the number of coils is not particularly limited as long as the number is greater than or equal to 2. It is to be noted that a first terminal of the semiconductor circuit portion 11 is electrically connected to one end of the coiled antenna portion 13, and a second terminal of the semiconductor circuit portion 11 is electrically connected to the other end of the coiled antenna portion 13. The semiconductor circuit portion 11 and the memory circuit portion 12 are electrically connected to each other.

In a case where an area of the semiconductor circuit portion 11 is the same as that in FIG. 1C and the memory circuit portion 12 and the coiled antenna portion 13 are disposed so as to overlap with each other (see FIG. 1B), a size of an area occupied by the memory circuit portion 12 can be enlarged. If the area occupied by the memory circuit portion 12 can be enlarged, more plural elements can be provided; therefore, a circuit with large memory capacity can be provided. Also in FIG. 1B, a first terminal of the semiconductor circuit portion 11 is electrically connected to one end of the coiled antenna portion 13, and a second terminal of the semiconductor circuit portion 11 is electrically connected to the other end of the coiled antenna portion 13. The semiconductor circuit portion 11 and the memory circuit portion 12 are electrically connected to each other.

Figure 2:
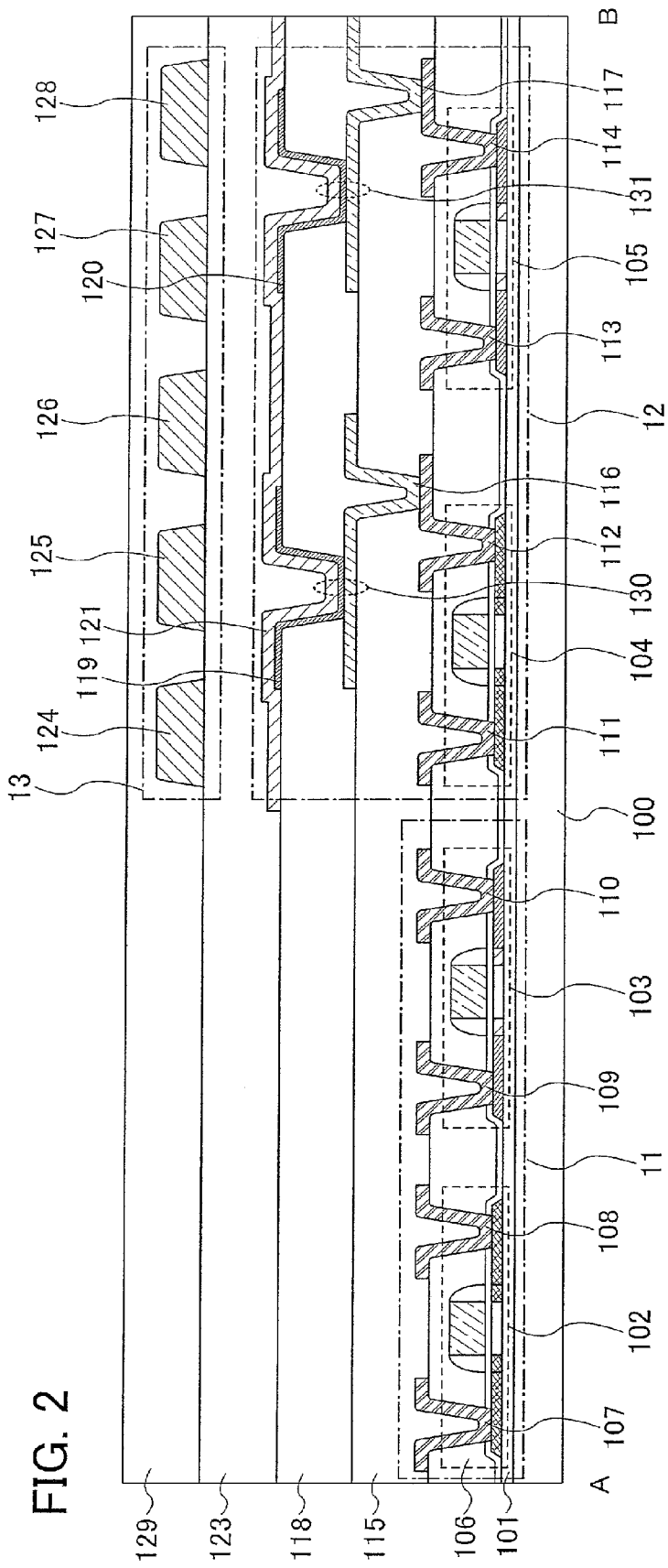
FIG. 2 is a view for explaining a structure of a semiconductor device according to the present invention.

Next, a cross-sectional structure of a semiconductor device having the above structure will be explained (see FIG. 2). The cross-sectional structure shown in FIG. 2 is a cross-sectional structure of a dot A to a dot B of the top surface structure of the semiconductor device shown in FIG. 1A.

Over a substrate 100 having an insulating surface, the semiconductor device of the present invention has an insulating layer 101 for a base, thin film transistors 102 to 105 provided over the insulating layer 101, an insulating layer 106 covering the thin film transistors 102 to 105, and wirings 107 to 114 each connected to a source or drain of the thin film transistors 102 to 105 through openings provided in the insulating layer 106.

Also, the semiconductor device has an insulating layer 115 covering the wirings 107 to 114, conductive layers 116 and 117 connected to the wirings 112 and 114, respectively, through openings provided in the insulating layer 115, an insulating layer 118 covering the conductive layers 116 and 117, layers 119 and 120 containing an organic compound, each of which is connected to the conductive layers 116 and 117 through openings provided in the insulating layer 118, and a conductive layer 121 connected to the layers 119 and 120 containing the organic compound. In addition, the semiconductor device has an insulating layer 123 covering the conductive layer 121, conductive layers 124 to 128 provided over the insulating layer 123, and an insulating layer 129 covering the conductive layers 124 to 128.

In the above cross-sectional structure, a portion including the thin film transistors 102 and 103 corresponds to the semiconductor circuit portion 11. A stacked body including the conductive layer 116, the layer 119 containing the organic compound, and the conductive layer 121 corresponds to a memory element 130. A stacked body including the conductive layer 117, the layer 120 containing the organic compound, and the conductive layer 121 corresponds to the memory element 131. A circuit including the memory elements 130 and 131 corresponds to the memory circuit portion 12. The conductive layers 124 to 128 correspond to the coiled antenna portion 13.

As in the above structure, the conductive layer 121 occupying the large area, which is included in the memory circuit portion 12, and the conductive layers 124 to 128 included in the coiled antenna portion 13 are disposed by overlapping with each other. Therefore, it is possible to prevent a current from flowing through the conductive layer 121 due to influence of electromagnetic induction. The memory circuit portion 12 and the coiled antenna portion 13 are disposed by being stacked together; therefore, downsizing can be realized.

Figure 3:
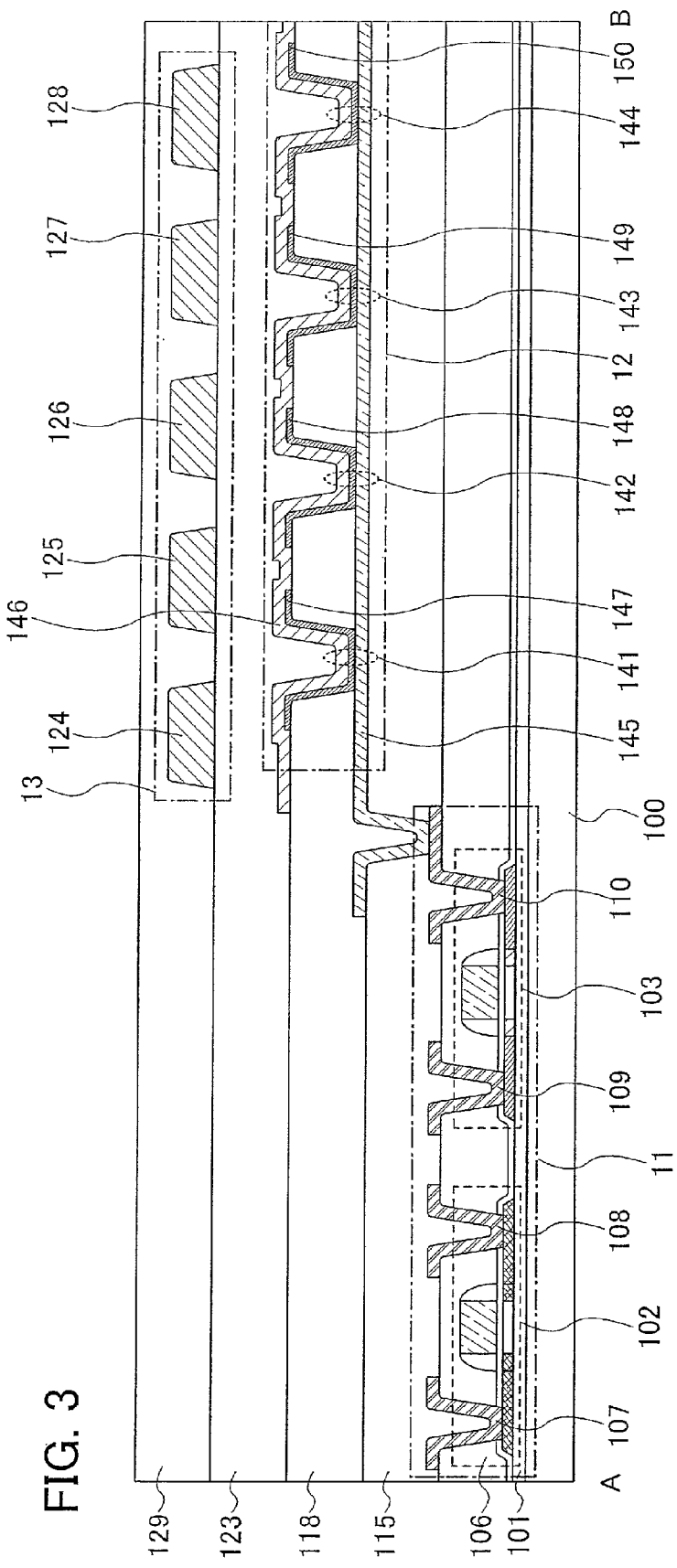
FIG. 3 is a view for explaining a structure of a semiconductor device according to the present invention.

Subsequently, a cross-sectional structure of a semiconductor device having a structure which differs from the above structure will be explained (see FIG. 3). Over a substrate 100 having an insulating surface, the semiconductor device has an insulating layer 101 for a base, thin film transistors 102 and 103 provided over the insulating layer 101, an insulating layer 106 covering the thin film transistors 102 and 103, and wirings 107 to 110 each connected to a source or drain of the thin film transistors 102 and 103 through openings provided in the insulating layer 106.

The semiconductor device has an insulating layer 115 covering the wirings 107 to 110, a conductive layer 145 connected to the wiring 110 through an opening provided in the insulating layer 115, an insulating layer 118 covering the conductive layer 145, layers 147 to 150 containing an organic compound, which is connected to the conductive layer 145 through openings provided in the insulating layer 118, and a conductive layer 146 connected to the layers 147 to 150 containing the organic compound. Also, the semiconductor device has an insulating layer 123 covering the conductive layer 146, conductive layers 124 to 128 provided over the insulating layer 123, and an insulating layer 129 covering the conductive layers 124 to 128. A stacked body including the conductive layer 145, any one of the layers 147 to 150 containing the organic compound, and the conductive layer 146 corresponds to each of memory elements 141 to 144.

As in the above structure, the conductive layers 145 and 146 occupying the large area, which is included in the memory circuit portion 12, and the conductive layers 124 to 128 included in the coiled antenna portion 12 are disposed by overlapping with each other. Therefore, it is possible to prevent a current from flowing through the conductive layer 121 due to influence of electromagnetic induction. The memory circuit portion 12 and the coiled antenna portion 13 are disposed by being stacked together; therefore, downsizing can be realized.

[Embodiment Mode 2]

In this embodiment mode, one example of a semiconductor device having the memory device shown in the above Embodiment Mode 1 will be explained with reference to the detailed drawings. A top view of a semiconductor device of this embodiment mode is shown in FIG. 8A and a cross-sectional view taken along a line X-Y in FIG. 8A is shown in FIG. 8B.

Figure 8A:
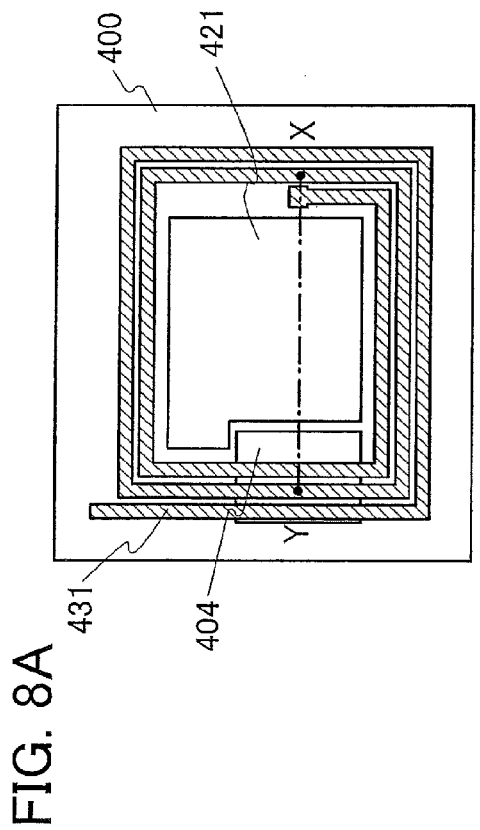
FIGS. 8A and 8B are cross-sectional views each explaining a structure of a semiconductor device according to the present invention.
Figure 8B:
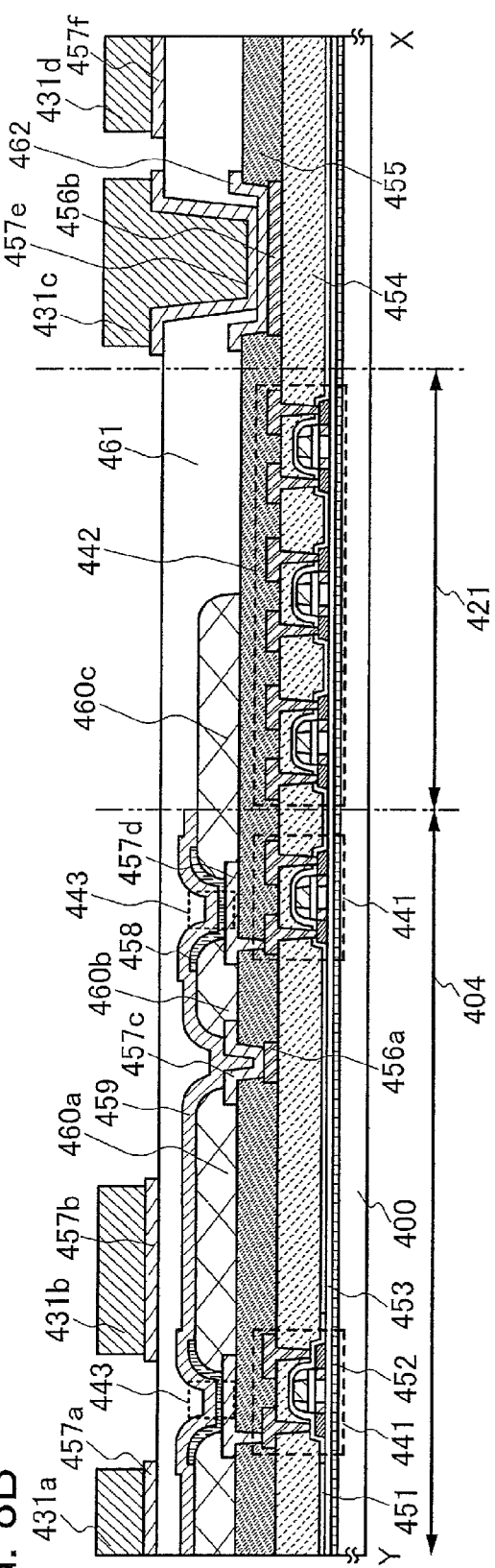

As shown in FIG. 8A, a memory element portion 404 which is a memory device having a memory element, an integrated circuit portion 421, and an antenna 431 are formed over a substrate 400. Each of FIGS. 8A and 8B shows a manufacturing process in progress and a state in which the memory element portion, the circuit portion, and the antenna are formed over the substrate 400 which can resist manufacturing conditions. Known material and manufacturing process may be used for a material and a manufacturing process of the memory device.

A transistor 441 is provided for the memory element portion 404 and a transistor 442 is provided for the integrated circuit portion 421, having a peeling layer 452 and an insulating layer 453 between the substrate 400 and the transistors 441 and 442. A tungsten film with a thickness of 50 to 200 nm is used for the peeling layer 452, and a silicon oxide film is used for the insulating layer 453. However, the peeling layer is not limited to the tungsten film, and a Mo film, an amorphous silicon film, or the like may also be used. An insulating layer 451, an insulating layer 454, and an insulating layer 455 are formed over the transistor 441 and the transistor 442. A memory element 443 including a first conductive layer 457d, an organic compound layer 458, and a second conductive layer 459 is formed over the insulating layer 455. The organic compound layer 458 is divided into individual pieces by an insulating layer 460b serving as a partition wall. The first conductive layer 457d is connected to a wiring layer of the transistor 441 and the memory element 443 is electrically connected to the transistor 441.

Openings (also referred to as contact holes) are formed in the insulating layer 455 so that the first conductive layer 457d and the transistor 441 are connected to each other, a conductive layer 457c and a wiring layer 456a are connected to each other, and a conductive layer 457e and a wiring layer 456b are connected to each other. Lower resistance is obtained by making the openings large and increasing a contact area of the conductive layers. Therefore, in this embodiment mode, the sizes of the openings are set in order from smallest to largest that the opening for connecting the first conductive layer 457d to the transistor 441 is set to be the smallest, the opening for connecting the conductive layer 457c to the wiring layer 456a is set to be the next smallest, and the opening for connecting the conductive layer 457e to the wiring layer 456b is set to be the largest. In this embodiment mode, the opening for connecting the first conductive layer 457d to the transistor 441 is set to be 5 µm×5 µm, the opening for connecting the conductive layer 457c to the wiring layer 456a is set to be 50 µm×50 µm, and the opening for connecting the conductive layer 457e to the wiring layer 456b is set to be 500 µm×500 µm.

In a semiconductor device in FIG. 8B, the second conductive layer 459 is stacked over the wiring layer 456a and the conductive layer 457c to be electrically connected to the wiring layer 456a and the conductive layer 457c. An electrode area in the second conductive layer 459 is larger than that of the first conductive layer 457d. In the present invention, this second conductive layer 459 and the antenna 431 are disposed so as to overlap with each other.

An insulating layer 461 is formed over the insulating layer 455. A stacked layer including a conductive layer 457a and an antenna 431a, a stacked layer including a conductive layer 457b and an antenna 431b, a stacked layer including the conductive layer 457e and an antenna 431c, and a stacked layer including a conductive layer 457f and an antenna 431d are formed over the insulating layer 461. The conductive layer 457e is formed by being in contact with a wiring layer 462 through an opening reaching the wiring layer 462, which is formed in the insulating layer 461. The wiring layer 462 is formed by being in contact with the wiring layer 456b through the opening reaching the wiring layer 456b, which is formed in the insulating layer 455. In this specification, a connecting portion between this antenna and the wiring layer below the antenna is referred to as an antenna power feeding portion. Although the antenna, the memory element portion 404, and the integrated circuit portion 421 are electrically connected to each other by using the wiring layer 462 and the wiring layer 456b here, the present invention is not particularly limited to this connection, and a structure in which the antennas 431c and 456b are electrically connected to each other may be employed.

The conductive layers 457a, 457b, 457e, and 457f under the antennas 431a, 431b, 431c, and 431d, respectively, also have an effect of improving adhesion between the insulating layer 455 and the antennas 431a, 431b, 43k, and 431d. In this embodiment mode, a polyimide film is used for the insulating layers 455 and 461, a titanium film is used for the conductive layers 457a, 457b, 457e, and 457f, and an aluminum film is used for the antennas 431a, 431b, 431c, and 431d.

An insulating layer 460c is partially fowled in the integrated circuit portion 421. In the transistor 442, there are a region which is covered with the insulating layer 460c and a region which is not covered with the insulating layer 460c.

Figure 9A:
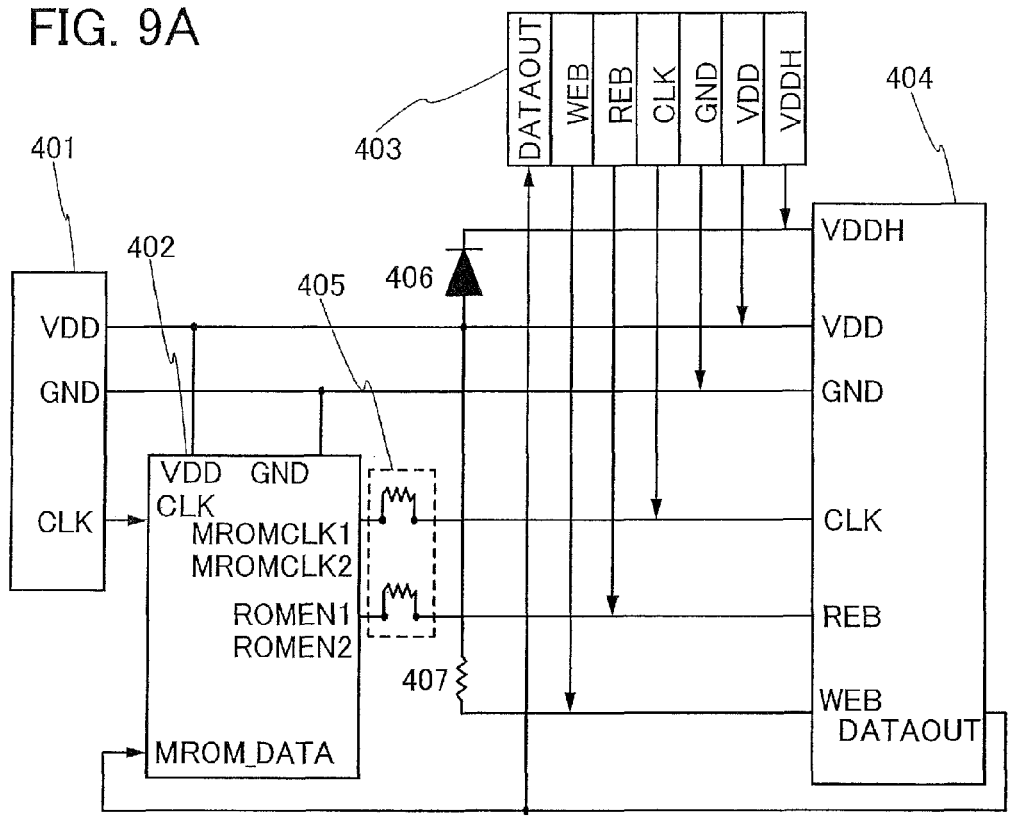
FIGS. 9A and 9B are circuit diagrams each explaining a structure of a semiconductor device according to the present invention.
Figure 9B:
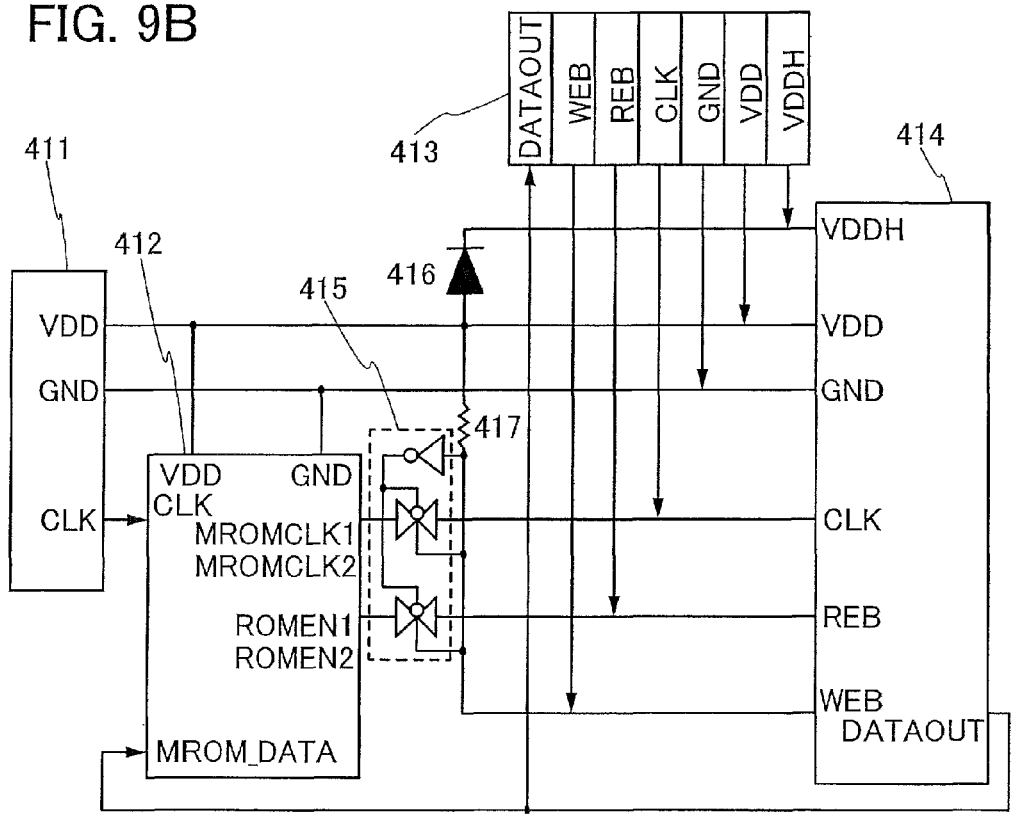
Figure 10:
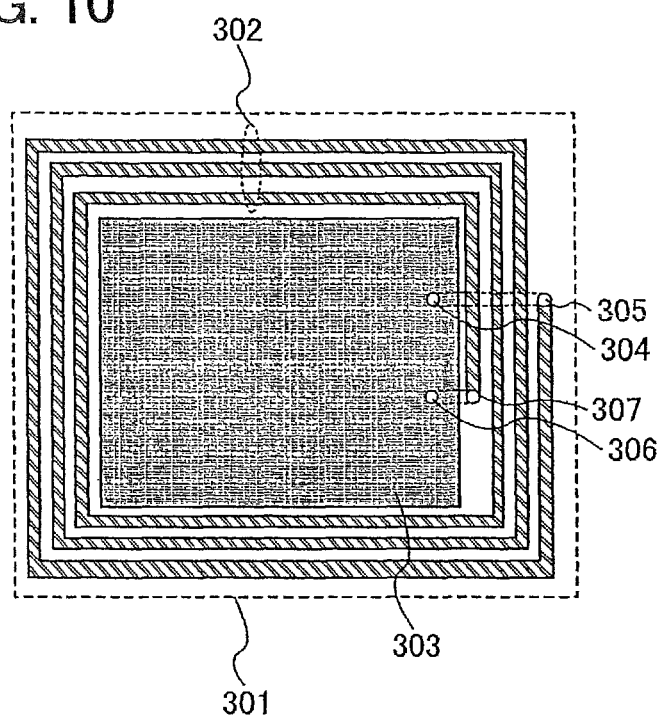
FIG. 10 is a view for explaining a structure of a semiconductor device.

Here, a block diagram relating to a circuit of the semiconductor device of this embodiment mode is shown in FIGS. 9A and 9B. A block diagram of the semiconductor device in FIG. 9A includes an RF input portion 401, a logic circuit portion 402, an external input portion 403, a memory element portion 404, an adjustment circuit portion 405, a diode 406, and a resistor 407. It is to be noted that the integrated circuit portion 421 shown in FIG. 8A corresponds to the RF input portion 401, the logic circuit portion 402, the external input portion 403, the adjustment circuit portion 405, the diode 406, or the resistor 407 in FIG. 9A.

A voltage and a signal input from an external input terminal is input to the memory element portion 404 and data (information) is written to the memory element portion 404. An AC signal is received by an antenna in the RF input portion 401, a signal and a voltage are input to the logic circuit portion 402. The signal becomes a control signal through the logic circuit portion 402, and the control signal is input to the memory element portion 404, whereby the written data is read again from the memory circuit portion 404.

FIG. 9B shows an example in which a structure of the adjustment circuit portion 405 of the semiconductor device differs from the structure thereof shown in FIG. 9A. The adjustment circuit portion 405 includes a resistor, whereas an adjustment circuit portion 415 includes a switch. A block diagram in FIG. 9B includes an RF input portion 411, a logic circuit portion 412, an external input portion 413, a memory element portion 414, the adjustment circuit portion 415, a diode 416, and a resistor 417. It is to be noted that the integrated circuit portion 421 shown in FIG. 8A corresponds to the RF input portion 411, the logic circuit portion 412, the external input portion 413, the adjustment circuit portion 415, the diode 416, or the resistor 417 in FIG. 9B.

The resistors 407 and 417 are a pull-up circuit and serve as an adjustment circuit portion. The adjustment circuit portion 405 performs adjustment so as to prevent an unnecessary control signal from being input to the memory element portion 404 from the logic circuit portion 402 when data is written to the memory element portion 404. In a similar manner, the resistor 407 also performs adjustment so as to prevent a signal from being input to the memory element portion 404 from the logic circuit portion 402 when data is written to the memory circuit portion 404. A signal from the external input portion 403 is blocked by the diode 406 when data is written to the memory element portion 404. On the other hand, when data is read from the memory element portion 404, DDH of the memory element portion 404 is fixed to VDD applied from the RF input portion 401 so as to be stabilized. Although the explanation is made on the basis of the block diagram of FIG. 9A, the explanation is also made on the basis of FIG. 9B.

The antenna electrically connected to the RF input portions 401 and 411 is provided so as to overlap with the memory device having the memory element portion. The antenna may overlap with a whole area of the electrode of the memory device or part area thereof. When a structure in which the antenna portion and the memory device overlap with each other is employed, an operation defect of the semiconductor device due to influence of noise or the like on a signal when the antenna communicates, fluctuation or the like in an electromotive force generated by electromagnetic induction, can be reduced, and reliability is improved. In addition, power saving of the semiconductor device can be realized. Moreover, the semiconductor device can be downsized.

The memory element 443 having the first conductive layer 457*d*, the organic compound layer 458, and the second conductive layer 459 shown in this embodiment mode has good adhesion; therefore, defects, such as peeling of a film at an interface due to force applied in a process in which the memory element 443 is transferred to a second substrate after being formed over the substrate 400 which is a first substrate (a glass substrate), do not occur. Accordingly, after the memory element is peeled with a favorable shape, the memory element is transferred to a paper or plastic substrate, and a lightweight and flexible memory device or a lightweight and flexible semiconductor device can be manufactured.

Since a memory device having the memory element manufactured in this embodiment mode has good adhesion, a peeling process and a transfer process can be performed in a favorable state, which makes it possible to freely transfer the memory device to various substrates. Therefore, choices for a material for the substrate is broaden. An inexpensive material can also be selected for the substrate. Not only a memory device and a semiconductor device can hold many functions depending on applications but also a memory device and a semiconductor device can be manufactured at low costs.

The present invention makes it possible to manufacture a memory device having a memory element with good adhesion which enables a transfer process to be performed in a favorable state. Accordingly, a memory device with higher reliability and a semiconductor device provided with the memory device can be manufactured with good yield without making a device or a process complicated.

The present invention including the above structure will be explained in more detail in the following embodiments.

[Embodiment 1]

Figure 4:
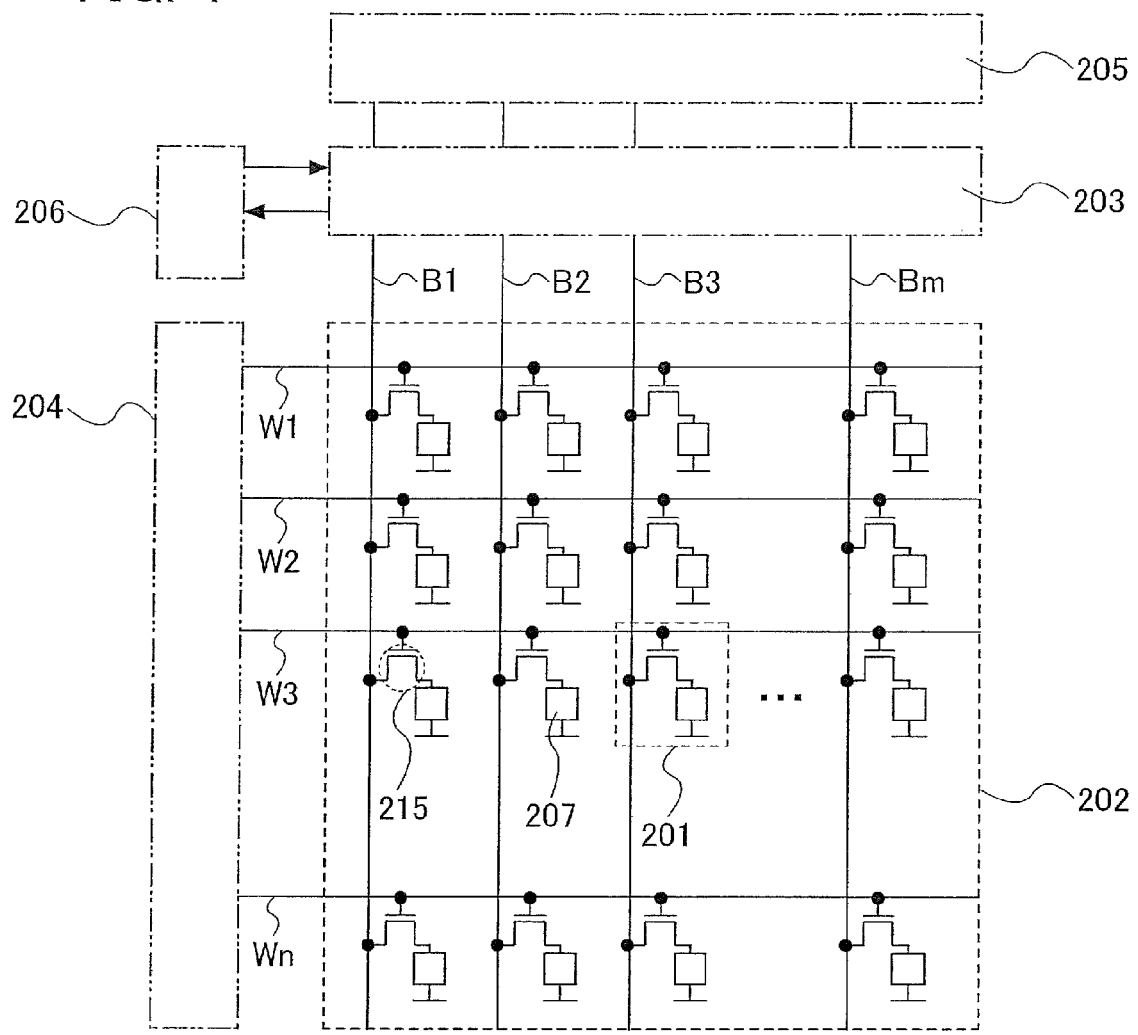
FIG. 4 is a view for explaining a structure of a semiconductor device according to the present invention.

A structure of a memory circuit portion included in the semiconductor device of the present invention will be explained (see FIGS. 4 and 5).

The memory circuit portion has a plurality of bit lines B1 to B*m* (m is a natural number), a plurality of word lines W1 to W*n* (n is a natural number), and a memory cell array 202 including a plurality of memory cells 201. The memory circuit portion also has a decoder 203 for controlling the plurality of bit lines B1 to B*m*, a decoder 204 for controlling the plurality of word lines W1 to W*n*, a selector 205, and a reading/writing circuit 206.

As a structure of the memory cell array 202, there are an active matrix type and a passive matrix type. In a case where the memory cell array 202 is an active matrix type, the memory cell 201 includes a transistor 215 and a memory element 207 (see FIG. 4). A gate of the transistor 215 is electrically connected to a word line W*b* ($1 \leq b \leq n$), and one of a source and a drain of the transistor 215 is electrically connected to a bit line B*a* ($1 \leq a \leq m$) and the other is electrically connected to one of a pair of electrodes included in the memory element 207.

Figure 5:
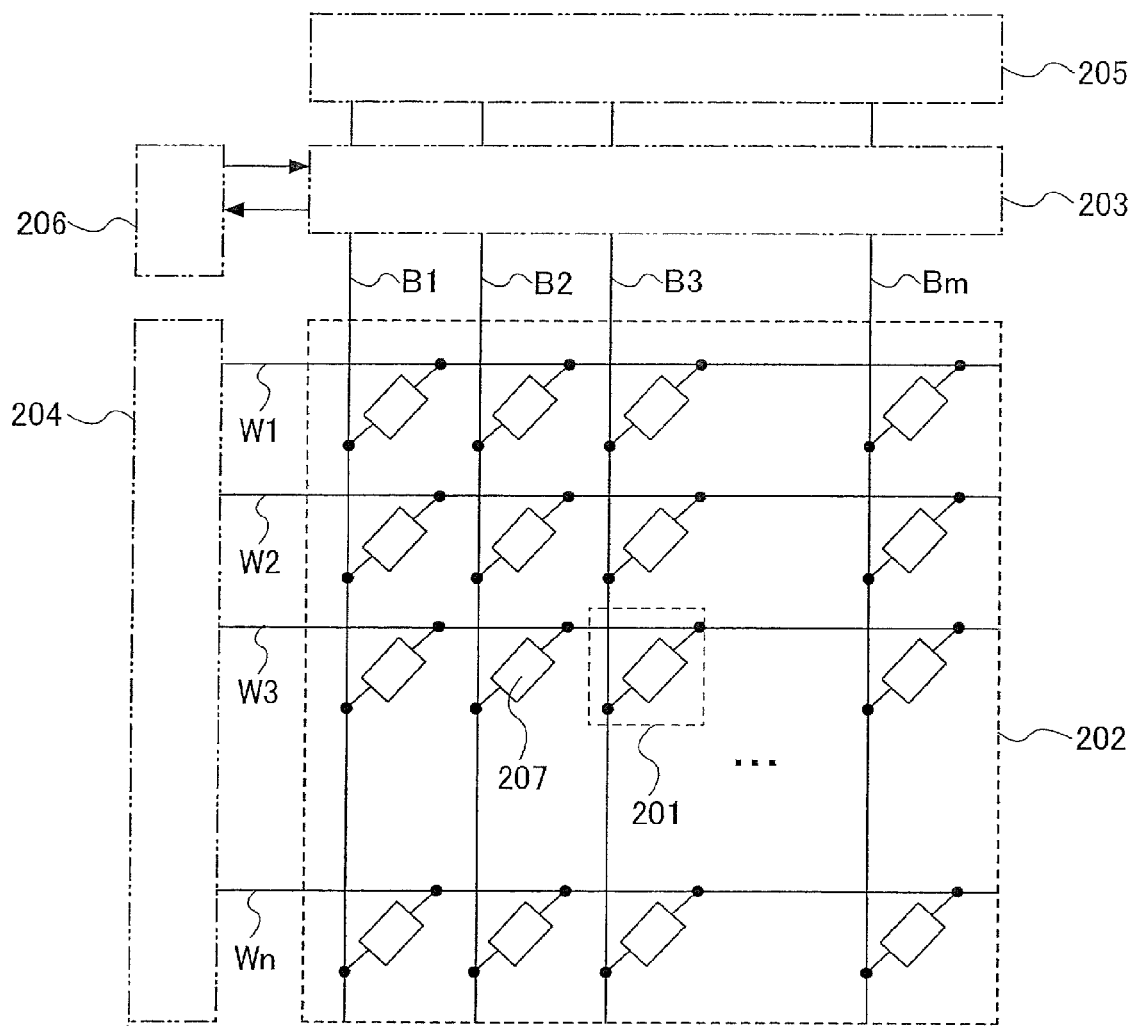
FIG. 5 is a view for explaining a structure of a semiconductor device according to the present invention.

In a case where a memory cell array 202 is a passive matrix type, a memory cell 201 includes a memory element 207 provided for a portion where a bit line B*a* and a word line W*b* intersect (see FIG. 5).

Next, an operation when data is written to the memory circuit portion will be explained.

First, a case where data is written to the memory circuit portion by an electric action will be explained. The memory cell 201 is selected by the decoder 203, the decoder 204, and the selector 205. Next, data is written to the selected memory cell 201 by the reading/writing circuit 206. Specifically, a predetermined voltage is applied to the memory element included in the selected memory cell 201, and accordingly, data is written by the reading/writing circuit 206. When the predetermined voltage is applied, a resistance of the memory element is changed. In the changes of the resistance of the memory element, there are a case where the resistance is increased and a case where the resistance is decreased. Data may be written with the use of either phenomenon. The phenomenon in which the resistance is increased uses a phenomenon in which a layer containing an organic compound interposed between a pair of electrodes becomes high-resistance by applying a predetermined voltage to a memory element. In addition, the phenomenon in which the resistance is decreased uses a phenomenon in which a distance between a pair of electrodes is shortened by applying a predetermined voltage to a memory element. In this manner, the memory circuit portion performs writing of data by the electric action with the use of the phenomenon in which the resistance of the memory element is changed. For example, when a memory element in an initial state has data of "0", the electric action is applied to a memory element to which data of "1" is written.

Subsequently, a case where data is written by an optical action will be explained. In this case, a layer containing an organic compound is irradiated with light by an optical irradiation apparatus (for example, a laser irradiation apparatus) from a light-transmissive conductive layer side. Accordingly, data is written to the memory element irradiated with light. A resistance of the memory element is changed by light irradiation. In the changes of the resistance of the memory element, there are a case where the resistance is increased and a case where the resistance is decreased. Data may be written with the use of either phenomenon. Accordingly, the memory circuit portion performs writing of data by the optical action with the use of the phenomenon in which the resistance of the memory element is changed. For example, when a memory element in an initial state has data of "0", the optical action is applied to a memory element to which data of "1" is written.

Next, an operation when data is read from the memory circuit portion will be explained.

Data is read by an electric action regardless of the method of writing data. Data is read by reading differences in resistance of the memory element by the decoders 203 and 204, the selector 205, and the reading/writing circuit 206.

Further, an element having a rectifying property may be provided between one of a pair of conductive layers and the layer containing the organic compound that are included in the memory element. The element having the rectifying property is a transistor in which a gate and a drain are electrically connected to each other, a diode, or the like. When the element having the rectifying property is provided, a direction of a flow of a current can be limited; accordingly, accuracy of reading of data can be improved.

Next, a material used for the layer containing the organic compound included in the memory element will be explained.

In a case where data is written to the memory element by the electric action, a low molecular-based material, a high molecular-based material, a singlet material, a triplet material, or the like may be used for the layer containing the organic compound. Not only a material formed of an organic compound but also a material partially containing an inorganic compound may be used for the layer containing the organic compound. Although a hole injecting layer, a hole transporting layer, a hole blocking layer, a light-emitting layer, an electron transporting layer, an electron injecting layer, or the like is used for the layer containing the organic compound, the layer containing the organic compound may be a single layer or a stacked layer including plural layers. The layer containing the organic compound may be formed by a droplet discharging method typified by an ink jet method. The use of a droplet discharging method makes it possible to improve use efficiency of the material, shorten manufacturing time by simplification of manufacturing steps, and reduce manufacturing costs.

In a case where data is written to the memory circuit portion by the optical action, a material of which property is changed by the optical action may be used for the layer containing the organic compound. For example, a conjugated high molecule doped with a compound (a photoacid generator) which generates acid by absorbing light may be used. As the conjugated high molecule, polyacetylenes, polyphenylene vinylenes, polythiophenes, polyanilines, polyphenylene ethynylenes, or the like may be used. As the photoacid generator, aryl sulfonium salt, aryl iodonium salt, o-nitrobenzyl tosylate, aryl sulfonic acid p-nitrobenzyl ester, sulfonyl acetophenones, Fe-arene complex PF6 salt, or the like may be used.

A memory device included in the semiconductor device of the present invention may be nonvolatile and capable of adding data. Also, the memory device included in the semiconductor device of the present invention may be a device in which data can be rewritten by an external electric action.

In this embodiment mode, a size of an antenna is approximately 9 mm×11 mm, the number of coils of the antenna is 9, the line width of the antenna itself is 150 μM, and a wiring of the antenna is coiled at a space of 10 μm. One of electrodes in the memory circuit portion, that is, an upper electrode is disposed so as to overlap with the antenna which is coiled in this manner. This upper electrode is provided over the layer containing the organic compound and is common in a plurality of memory elements. In a case of forming a memory circuit having amount of information of 1 kilobit, a size of this upper electrode may be approximately 1.5 mm×3 mm. It is to be noted that the size of the upper electrode is not particularly limited, and the size can be smaller than 4.5 mm$^2$.

By disposing the antenna and a conductive layer occupying a large area (the upper electrode: 4.5 mm$^2$) so as to overlap with each other, a space can be efficiently used in comparison with a case where nothing is formed in a region overlapping with the antenna. Therefore, downsizing of the semiconductor device can be realized.

The upper electrode occupying a large area and the coiled antenna portion are disposed by being stacked together; therefore, it is possible to prevent a current from flowing through the upper electrodes included in the memory circuit portion, and thus, power saving can be achieve.

This embodiment can be freely combined with Embodiment Mode 1 or 2.

[Embodiment 2]

Figure 6:
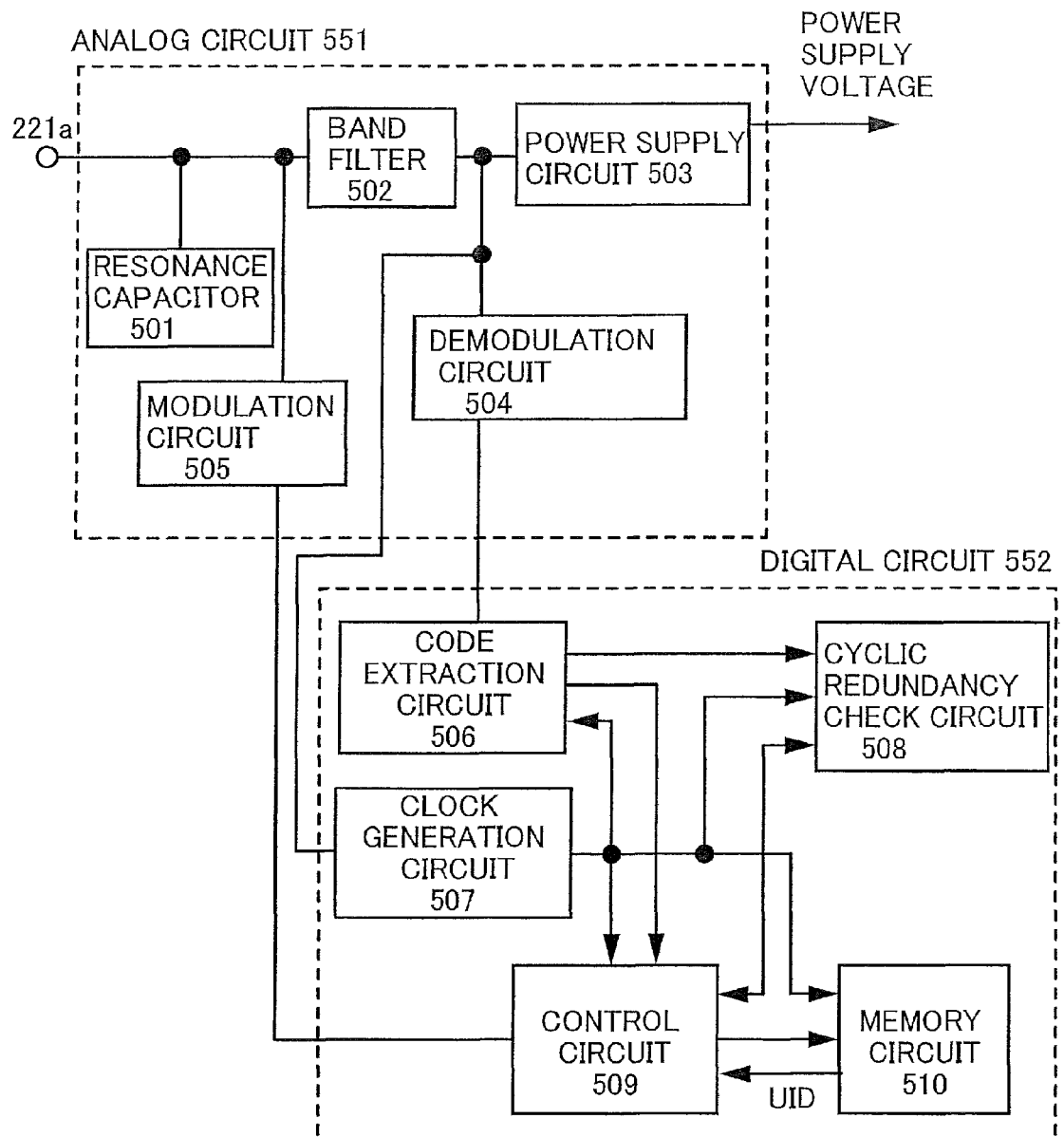
FIG. 6 is a view for explaining a structure of a semiconductor device according to the present invention.

A structure of a semiconductor circuit portion included in the semiconductor device of the present invention will be explained (see FIG. 6).

The semiconductor circuit portion includes an analog circuit 551 and a digital circuit 552. The analog circuit 551 has a resonance capacitor 501, a band filter 502, a power supply circuit 503 including a rectifying circuit and a storage capacitor, a demodulation circuit 504, a modulation circuit 505, and the like. The digital circuit 552 includes a code extraction circuit 506, a clock generation circuit 507, a cyclic redundancy check circuit 508, a control circuit 509, a memory circuit 510, and the like.

An operation when the semiconductor device receives data will be explained. A wireless signal (a modulated carrier wave) input from a coiled antenna is input from a terminal 221a to the analog circuit 551. The input wireless signal is input to the power supply circuit 503 and the demodulation circuit 504 after a desired frequency component is extracted by the band filter 502. The modulated carrier wave input via the band filter 502 is rectified by the rectifying circuit included in the power supply circuit 503, and furthermore, smoothed by the storage capacitor included in the power supply circuit 503. Accordingly, the power supply circuit 503 generates a DC voltage. The DC voltage generated in the power supply circuit 503 is supplied to each circuit as a power supply voltage.

The modulated carrier wave input via the band filter 502 is input to the clock generation circuit 507 in the digital circuit 552. A clock generated in the clock generation circuit 507 is supplied to each circuit. The modulated carrier wave input via the band filter 502 is demodulated by the demodulation circuit 504, and the demodulated signal is input to the digital circuit 552. A signal obtained by demodulating the modulated carrier wave by the demodulating circuit 504 is input to the code extraction circuit 506 and a code included in the signal is extracted. An output of the code extraction circuit 506 is input to the control circuit 509 and a code is extracted. The extracted code is input to the cyclic redundancy check circuit 508 and arithmetic processing for identifying send errors is performed. Accordingly, the cyclic redundancy check circuit 508 outputs whether received data has an error, to the control circuit 509.

Next, an operation when the semiconductor device sends data will be explained. The memory circuit 510 outputs stored unique identifier (UID) to the control circuit 509 in accordance with a signal input from the control circuit 509. The cyclic redundancy check circuit 508 calculates a CRC code corresponding to send data and outputs the CRC code to the control circuit 509. The control circuit 509 adds the CRC code to the send data. Also, the control circuit 509 encodes data in which the CRC code is added to the send data. Furthermore, the control circuit 509 converts encoded information into a signal for modulating a carrier wave in accordance with a predetermined modulation method. The output of the control circuit 509 is input to the modulation circuit 505 in the analog circuit 551. The modulation circuit 505 load-modulates the carrier wave in accordance with the input signal and outputs the carrier wave to the coiled antenna portion.

This embodiment can be freely combined with Embodiment Mode 1, 2, or Embodiment 1.

[Embodiment 3]

In this embodiment, applications of a semiconductor device of the present invention will be explained. For example, the semiconductor device of the present invention can be provided for bills; coins; securities; bearer bonds; certificates (such as driver's licenses and resident's cards); packing containers (such as wrapping paper and bottles); recording media such as DVDs (Digital Versatile Disc), and video tapes; vehicles such as cars and bicycles; personal belongings such as bags and glasses; foods; clothes; commodities; electronic appliances; and the like. The electronic appliances include a liquid crystal display device, an EL (electroluminescence) display device, a television device, a mobile phone, and the like.

The semiconductor device of the present invention can be fixed to an object by being attached to a surface of the object or embedded in the object. For example, the semiconductor device may be embedded in paper of a book, or an organic resin of a package formed of the organic resin. The semiconductor device is provided for bills, coins, securities, bearer bonds, certificates, and the like, whereby forgery thereof can be prevented. Furthermore, the semiconductor device is provided for wrapping containers, recording media, personal belongings, foods, clothes, commodities, electronic appliances, and the like, whereby an inspection system, a system of a rental shop, and the like can be performed more efficiently. The semiconductor device is provided for vehicles, whereby vehicles can be prevented from being forged or stolen. In addition, when the semiconductor device is implanted into creatures such as animals, each creature can be identified easily. For example, the semiconductor device is implanted into creatures such as domestic animals, which enables easy identification of the year of birth, sex, breed, and the like thereof. As described above, the semiconductor device of the present invention can be provided for any objects (including creatures) and used.

Figure 7:
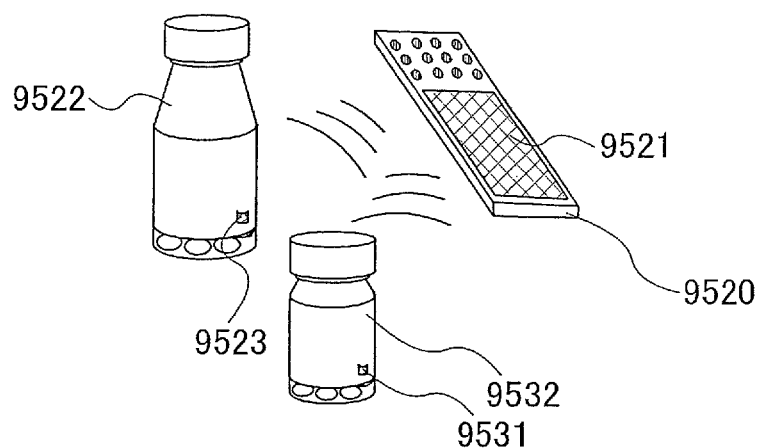
FIG. 7 is a view for explaining a structure of a semiconductor device according to the present invention.

Subsequently, one mode of a system in which the semiconductor device is used will be explained with reference FIG. 7. A terminal 9520 including a display portion 9521 is provided with an antenna and a reader/writer connected to the antenna. An object 9532 is provided with a semiconductor device 9531 of the present invention and an object 9522 is provided with a semiconductor device 9523 of the present invention. When the antenna of the terminal 9520 is held close to the semiconductor device 9531 included in the object 9532, the display portion 9521 displays information on the object 9532 such as a raw material, a place of origin, a test result in each production process, a record of distribution, and description of the article. When the antenna of the terminal 9520 is held close to the semiconductor device 9523 included in the object 9522, the display portion 9521 displays information on the object 9522 such as a raw material, a place of origin, a test result in each production process, a record of distribution, and description of the object.

This embodiment can be freely combined with Embodiment Mode 1, 2, Embodiment 1, or 2.

This application is based on Japanese Patent Application serial no. 2006-033473 filed in Japan Patent Office on Feb. 10, 2006, the entire contents of which are hereby incorporated by reference.

What is claimed is:

1. A semiconductor device comprising:
a semiconductor circuit portion and a light-emitting circuit portion side by side over a substrate having an insulating surface; and
a conductive layer portion over the light-emitting circuit portion,
wherein the light-emitting circuit portion comprises an entirety of light-emitting elements comprised in said semiconductor device, each of said light-emitting elements comprising a first electrode, a second electrode and a layer containing an organic compound interposed between the first electrode and the second electrode,
wherein the light-emitting circuit portion is electrically connected to the semiconductor circuit portion,
wherein the light-emitting circuit portion has a length and a width shorter than the length,
wherein an entirety of the semiconductor circuit portion is surrounded by, but not directly overlapped with, the conductive layer portion when seen from a top of the semiconductor device,
wherein the conductive layer portion overlaps with an entirety of the length of the light-emitting circuit portion,
wherein the conductive layer portion overlaps with a part of the width of the light-emitting circuit portion, and
wherein the conductive layer portion comprises an opening disposed over the light-emitting element of the light-emitting circuit portion wherein the conductive layer portion comprises a power feeding portion and a plurality of linear or stripe-shaped conductive layer conductors, and the conductive layer conductor is provided in spirals from a periphery of the power feeding portion toward the power feeding portion.

2. The semiconductor device according to claim 1, wherein the substrate having the insulating surface is glass, plastic, or paper.

3. A semiconductor device comprising:
a semiconductor circuit portion and a light-emitting circuit portion side by side over a substrate having an insulating surface; and
a conductive layer portion over the light-emitting circuit portion,
wherein the light-emitting circuit portion comprises an entirety of light-emitting elements comprised in said semiconductor device, each of said light-emitting elements comprising a first electrode, a second electrode and a layer containing an organic compound interposed between the first electrode and the second electrode,
wherein the light-emitting circuit portion is electrically connected to the semiconductor circuit portion,
wherein the light-emitting circuit portion has a length and a width shorter than the length,
wherein an entirety of the semiconductor circuit portion is surrounded by, but not directly overlapped with, the conductive layer portion when seen from a top of the semiconductor device,
wherein the conductive layer portion overlaps with an entirety of the length of the light-emitting circuit portion,
wherein an area of the semiconductor circuit portion is larger than an area of the light-emitting circuit portion,
wherein the conductive layer portion overlaps with a part of the width of the light-emitting circuit portion, and
wherein the conductive layer portion comprises an opening disposed over the light-emitting element of the light-emitting circuit portion,
wherein the conductive layer portion wherein the conductive layer portion comprises a power feeding portion and a plurality of linear or stripe-shaped conductive layer conductors, and the conductive layer conductor is provided in spirals from a periphery of the power feeding portion toward the power feeding portion.

4. The semiconductor device according to claim 3, wherein the substrate having the insulating surface is glass, plastic, or paper.

* * * * *

UNITED STATES PATENT AND TRADEMARK OFFICE
CERTIFICATE OF CORRECTION

| | |
|---|---|
| PATENT NO. | : 9,437,777 B2 |
| APPLICATION NO. | : 14/306559 |
| DATED | : September 6, 2016 |
| INVENTOR(S) | : Tamae Takano et al. |

Page 1 of 1

It is certified that error appears in the above-identified patent and that said Letters Patent is hereby corrected as shown below:

In the Specification
At Column 7, Line 60, "43k," should be --431c,--;
At Column 7, Line 66, "fowled" should be --formed--;
At Column 11, Line 33, "150 μM," should be --150 μm,--;

In the Claims
In Claim 1, at Column 14, Line 14, "portion" should be --portion,--;
In Claim 3, at Column 14, Lines 53-54, "wherein the conductive layer portion wherein the conductive layer portion comprises" should be --wherein the conductive layer portion comprises--.

Signed and Sealed this
Third Day of January, 2017

Michelle K. Lee
*Director of the United States Patent and Trademark Office*